(12) United States Patent
Colburn et al.

(10) Patent No.: US 7,776,628 B2
(45) Date of Patent: Aug. 17, 2010

(54) METHOD AND SYSTEM FOR TONE INVERTING OF RESIDUAL LAYER TOLERANT IMPRINT LITHOGRAPHY

(75) Inventors: Matthew E. Colburn, Hopewell Junction, NY (US); Theodore G. van Kessel, Millbrook, NY (US); Yves C. Martin, Ossining, NY (US); Dirk Pfeiffer, Dobbs Ferry, NY (US)

(73) Assignee: International Business Machines Corporation, Armonk, NY (US)

( * ) Notice: Subject to any disclaimer, the term of this patent is extended or adjusted under 35 U.S.C. 154(b) by 860 days.

(21) Appl. No.: 11/600,140

(22) Filed: Nov. 16, 2006

(65) Prior Publication Data

US 2008/0118645 A1    May 22, 2008

(51) Int. Cl.
  *H01L 21/00* (2006.01)
(52) U.S. Cl. .......................... 438/22; 716/19
(58) Field of Classification Search .......... None
See application file for complete search history.

(56) References Cited

U.S. PATENT DOCUMENTS

| | | | |
|---|---|---|---|
| 7,186,656 B2 * | 3/2007 | Sreenivasan | 438/700 |
| 7,244,386 B2 * | 7/2007 | Sreenivasan et al. | 264/496 |
| 7,338,275 B2 * | 3/2008 | Choi et al. | 425/385 |
| 2005/0260848 A1 | 11/2005 | Sreenivasan | |
| 2007/0105356 A1 * | 5/2007 | Wu et al. | 438/584 |
| 2007/0138699 A1 * | 6/2007 | Wuister et al. | 264/319 |
| 2007/0158872 A1 * | 7/2007 | Jeong et al. | 264/220 |
| 2007/0187875 A1 * | 8/2007 | Terasaki et al. | 264/496 |
| 2007/0261016 A1 * | 11/2007 | Sandhu et al. | 716/19 |
| 2007/0267764 A1 * | 11/2007 | Morimoto | 264/1.1 |
| 2008/0028360 A1 * | 1/2008 | Picciotto et al. | 716/21 |
| 2008/0085362 A1 * | 4/2008 | Yen et al. | 427/128 |
| 2008/0113157 A1 * | 5/2008 | Lee et al. | 428/141 |

FOREIGN PATENT DOCUMENTS

| | | |
|---|---|---|
| CN | 1054468 C | 7/2000 |
| WO | 2005/10024 A1 | 10/2005 |

* cited by examiner

*Primary Examiner*—Thao P. Le
(74) *Attorney, Agent, or Firm*—McGinn IP Law Group PLLC; Vazken Alexanian

(57) ABSTRACT

A method (and apparatus) of imprint lithography, includes imprinting, via a patterned mask, a pattern into a resist layer on a substrate, and overlaying a cladding layer over the imprinted resist layer. A portion of the cladding layer is used as a hard mask for a subsequent processing.

16 Claims, 7 Drawing Sheets

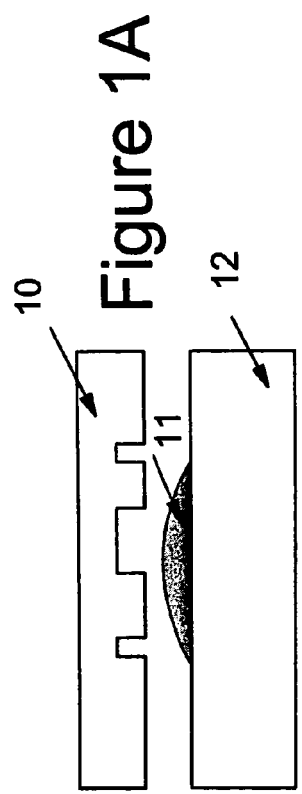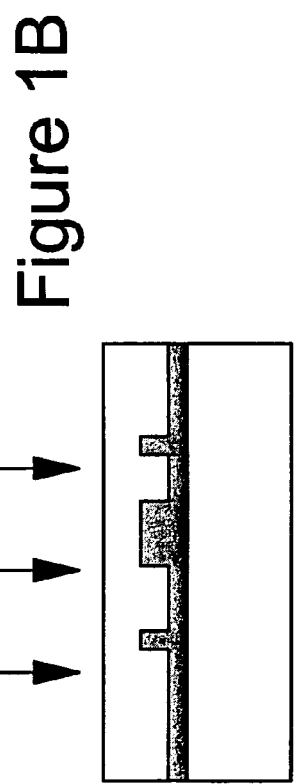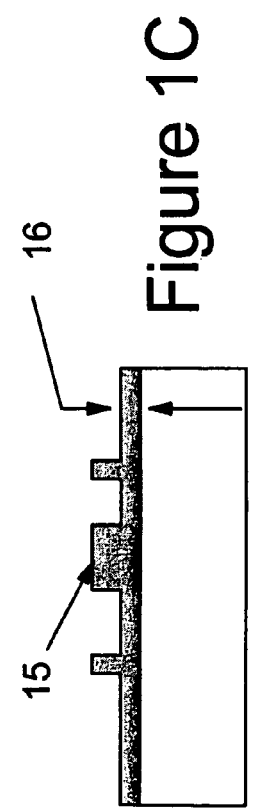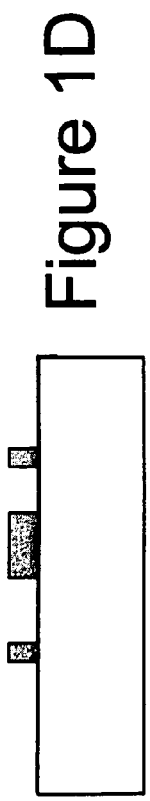

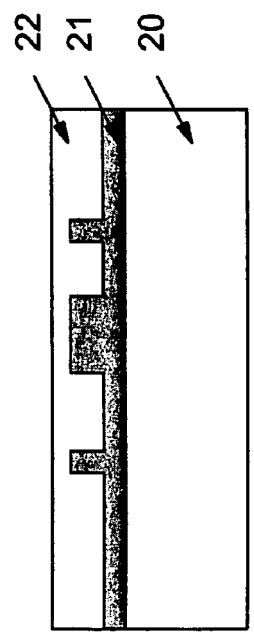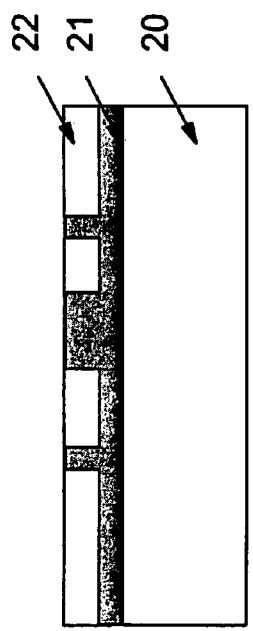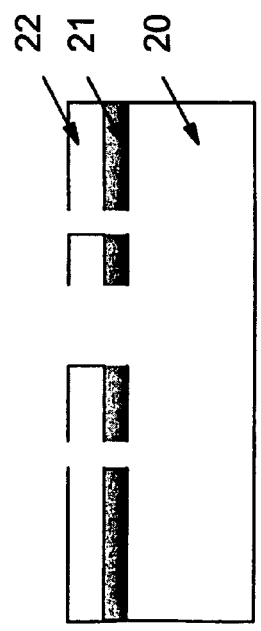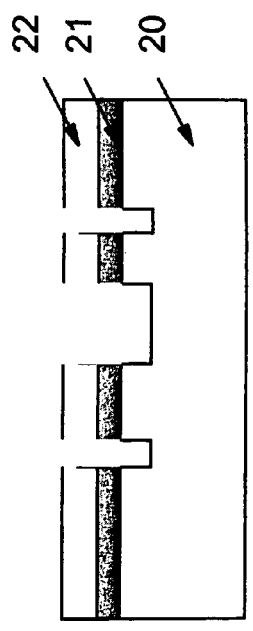

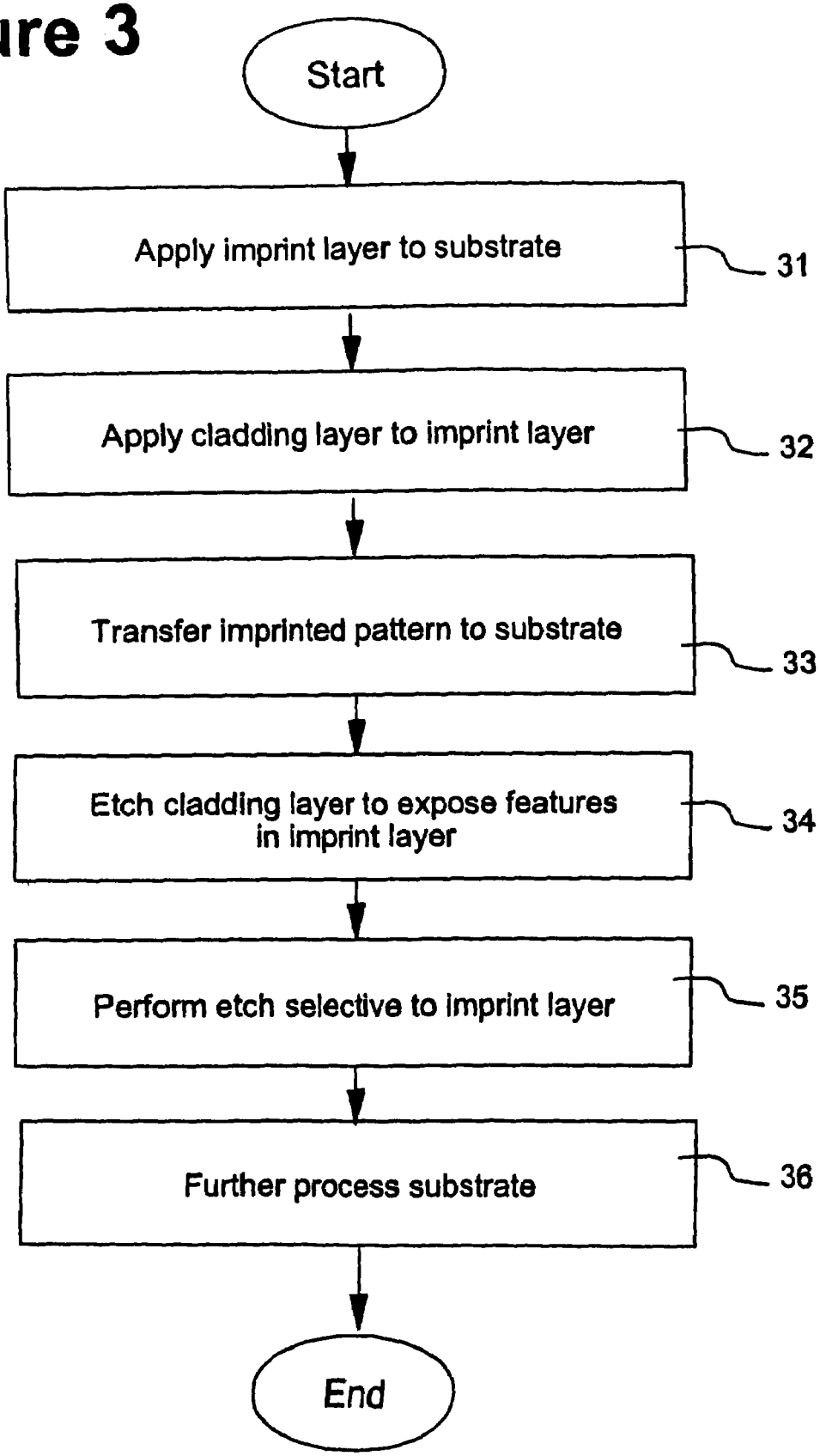

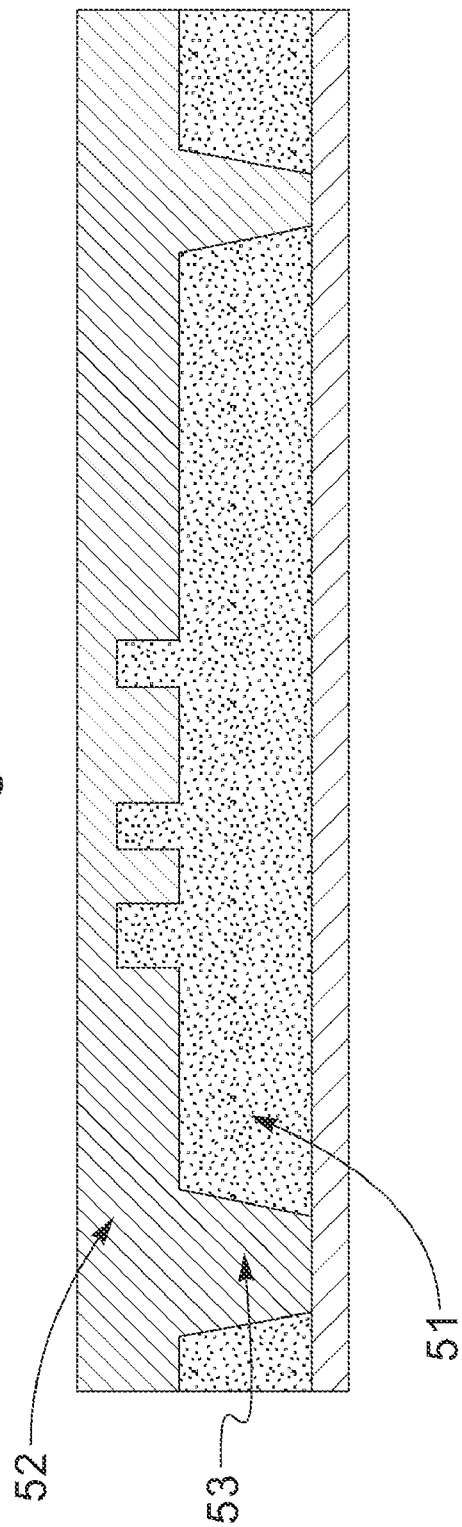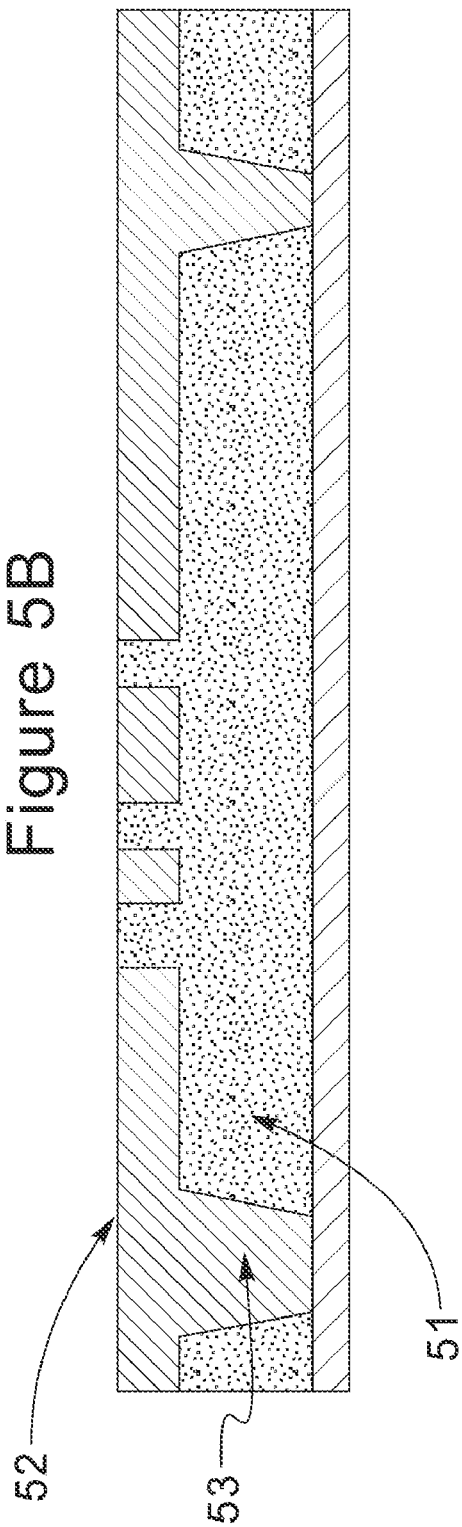

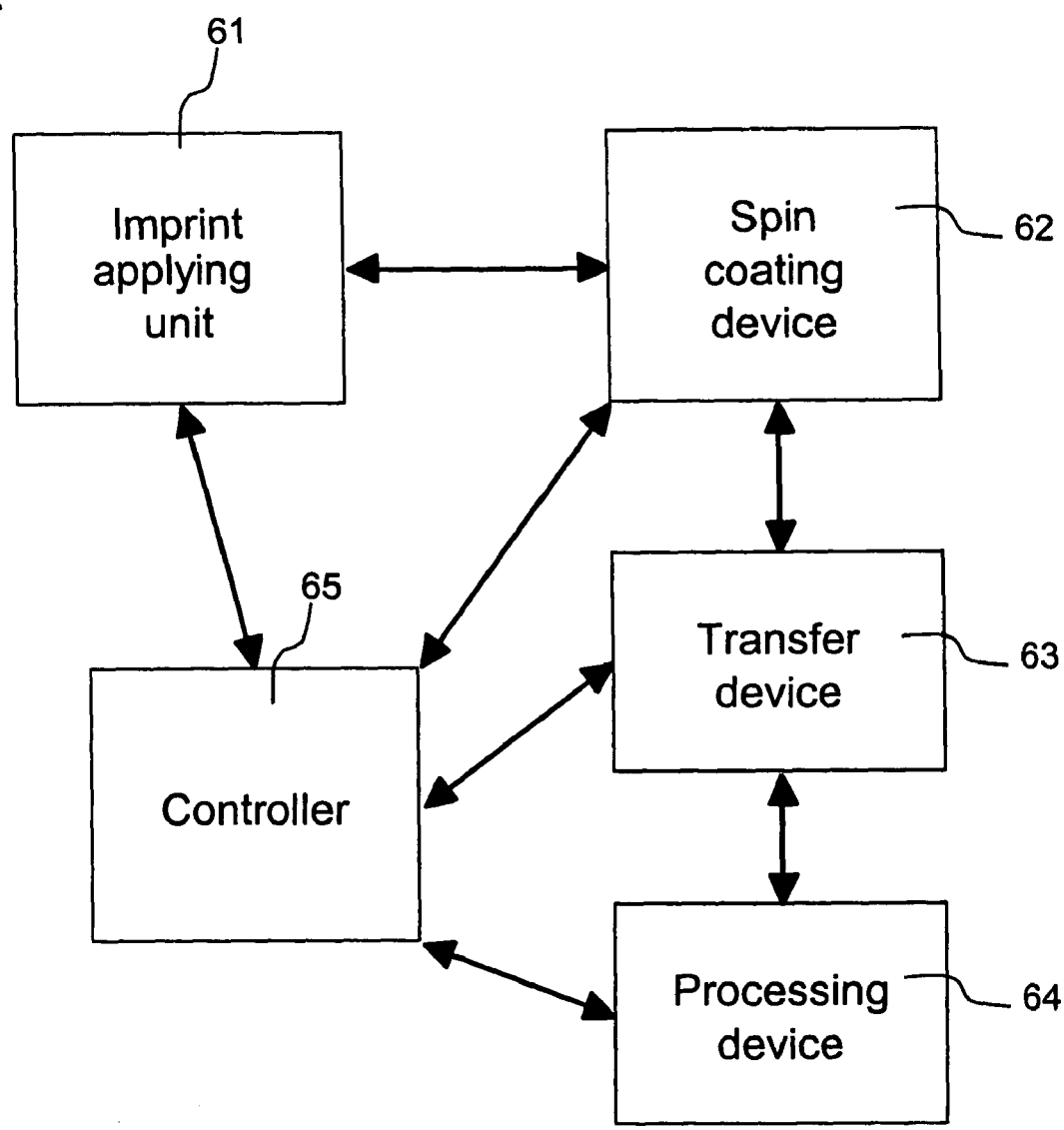

METHOD AND SYSTEM FOR TONE INVERTING OF RESIDUAL LAYER TOLERANT IMPRINT LITHOGRAPHY

BACKGROUND OF THE INVENTION

1. Field of the Invention

The present invention generally relates to a method and apparatus for lithography, and more particularly to a method and apparatus for imprint residual layer management.

2. Description of the Related Art

Imprint lithography describes a class of lithographic methods in which a flat mold 10 (e.g., a transparent mold or template) is pressed into a liquid polymer (resist) 11 on a flat substrate 12, as shown in FIG. 1A.

Then, as shown in FIG. 1B, the polymer 11 is cured by exposure to light 13 (e.g., in the case where a transparent mold is used) or heat.

Thereafter, as shown in FIG. 1C, the mold 10 is removed leaving behind an impression of the features of the mold 10 in the polymer 11. In practice, the mold 10 is typically flat with fine depth features etched in its surface. In cases of practical interest, these features can have dimensions that range from many microns to nanometers. The intent is usually to transfer the relief pattern 15 in the polymer resist 11 into the substrate material using an etch process.

FIG. 1D shows the residual layer 16 of the polymer resist 11 after etching to expose the surface of the substrate 12.

It is desirable to press the mold into the resist such that very little resist (e.g., on the order of about 50% of the feature height or less) remains between the unfeatured portions of the mask and the substrate 12. Often as little as 40 nm thickness or less is desirable.

Further, it is essential to the subsequent etch process that this residual layer 16 thickness be extremely uniform. Practically, this is extremely difficult to achieve due to the viscosity of the resist, flatness and flexibility of the mold 10 and substrate 12 and particulate contamination.

This results in the need to use ultra-clean, extremely precise, slow and costly methods to perform lithography at the micron to nanometer scales that are of interest. Considerable cost and effort must be expended to develop systems that reduce and homogenize the residual layer.

Thus, a large challenge in the conventional techniques is achieving a suitable ratio of the thickness of the residual layer to the thickness of the feature, and thus such ratio typically dictates the process window. Practically, obtaining the residual layer extremely thin is difficult to achieve, as mentioned above.

Indeed, one can imagine that the mask is 1 centimeter (or up to many inches) square and that the resist is not very viscous, but has a finite viscosity, pressing the same to 50 nanometers is difficult to perform. That is, as the residual layer becomes thinner and thinner, the viscous shear force increases accordingly and eventually a large amount of force is required (for pressing) to achieve the desired thinness. This force has the tendency to warp the mask and substrate causing further inhomogeneities. Finally, as the residual layer thins, more time is required for it to move out of the way.

Additionally, as mentioned above, uniformity is problematic since if one desires a residual layer thickness of 50 nanometers nominally, one wants 50 nanometer thickness everywhere and this requires that the mask be perfect, and that the surface and resist must be particle-free. Any particulate contamination that is larger than the desired residual thickness will cause local distortions of the mask and substrate. These distortions result in a final print defect that is larger in size than the original particle that caused it.

SUMMARY OF THE INVENTION

In view of the foregoing and other exemplary problems, drawbacks, and disadvantages of the conventional methods and structures, an exemplary feature of the present invention is to provide a method and structure for imprint lithography, and more particularly for imprint residual layer management.

Another exemplary feature of the present invention is to provide a method (and system) of imprint lithography which uses a system of masks and photoresists that is tolerant of particulate contamination, residual layer thickness and of uniformity variations and yet produces high resolution/high aspect resist structures.

In a first exemplary aspect of the present invention, a method (and apparatus) of imprint lithography, includes imprinting, via a patterned mask, a pattern into a resist layer on a substrate, and overlaying a cladding layer over the imprinted resist layer. A portion of the cladding layer is used as a hard mask for a subsequent processing.

In a second exemplary embodiment of the invention, an imprint lithography method, includes placing a planarizing, cladding layer over an imprinted layer, wherein a portion of the cladding layer is used as a hard mask for a subsequent processing.

In a third exemplary embodiment of the present invention, a system for imprint lithography, includes an imprint applying unit that imprints, via a patterned mask, a pattern into a resist layer on a substrate, and a spin coating device that overlays a cladding layer over the imprinted resist layer. A portion of the cladding layer is used as a hard mask for a subsequent processing.

The exemplary embodiments primarily employ photoresist as the illustrative example. However, it is noted that thermal cure or catalytic cure-type resists are also equally applicable. In principle, any material that can be imprinted and hardened in place could be used. Practically, the materials of choice are usually a low viscosity polymer that hardens to a consistency that holds a stable pattern once the mask is removed, and that can be conveniently etched in subsequent processing.

With the invention, the photoresist is printed with whatever residual layer one gets. Thus, the residual layer can be made relatively thick, but can be made highly uniform. In an exemplary embodiment, support pads or "feet" are placed on the photomask. These feet elevate the mask to a known and defined height over the substrate. The supporting pads perform two functions. First, they help to ensure that the photoresist has a uniform thickness across the printed field. Secondly, they reduce the probability that a foreign particle can lodge between the mask and substrate and deform the gap and corresponding photoresist thickness. The height of the feet is usually chosen to be larger than most of the ambient contamination.

Hence, the pattern is printed and then on top of the photoresist which has a uniform thickness. A planarizing photoresist (e.g., an etch resistant cladding layer) is spun on top of the photoresist. The planarizing photoresist is formed of a material intended to be somewhat selective in terms of its etch resistance, relative to the imprinted material. Then, an etch is performed on the planarizing resist to expose the tops of the photo resist, and then the process switches to a second etch gas, to etch the photoresist (but leaves the spun-on material alone) down to the substrate.

As a result of the selectivity between the cladding layer and the resist, it is possible to obtain very high aspect ratio (up to 10:1, etc.; where the thickness of the residual layer is large in comparison to the height of the feature) structures which are printed with a highly variable residual layer. Thus, the invention is tolerant of residual layer thickness, particulates, and little variations in uniformity.

There are several implications which the invention recognizes. First, the planarizing resist truly does planarize and additionally the mask (or template) is etched uniformly in most cases. Neither of these is a very unusual or difficult constraint to accommodate. That is, the invention will tolerate if the template is slightly tilted or slightly bowed. Also, since the residual layer can be made thicker with the invention, then the time needed to press the template to thin out the residual layer is reduced significantly. Thus, the invention allows for high throughput and high robustness.

As a result, there is no need to use ultra-clean, extremely precise, and costly methods to perform lithography at the micron to nanometer scales that are of interest. Hence, the invention achieves a suitable ratio of the thickness of the residual layer to the thickness of the feature.

Thus, with the invention, a simple method of imprint lithography is provided using a system of masks and photoresists that is tolerant of particulate contamination, residual layer thickness and of uniformity variations and yet produces high resolution/high aspect resist structures.

BRIEF DESCRIPTION OF THE DRAWINGS

The foregoing and other exemplary purposes, aspects and advantages will be better understood from the following detailed description of an exemplary embodiment of the invention with reference to the drawings, in which:

FIGS. 1A-1D illustrate a simple imprint lithography process;

FIGS. 2A-2D illustrate a spin-cladded imprint lithography process;

FIG. 3 illustrates a flowchart of a method 30 according to the present invention;

FIG. 5A illustrates a structure 50 after printing and a planarizing resist 52 coating over an organic resist 51, and which illustrates spacer feet 53;

FIG. 5B illustrates the structure of FIG. 5A after etching of the planarizing resist 52;

FIG. 6 illustrates an imprint lithography system 60 according to the present invention.

DETAILED DESCRIPTION OF EXEMPLARY EMBODIMENTS OF THE INVENTION

Figure 4:
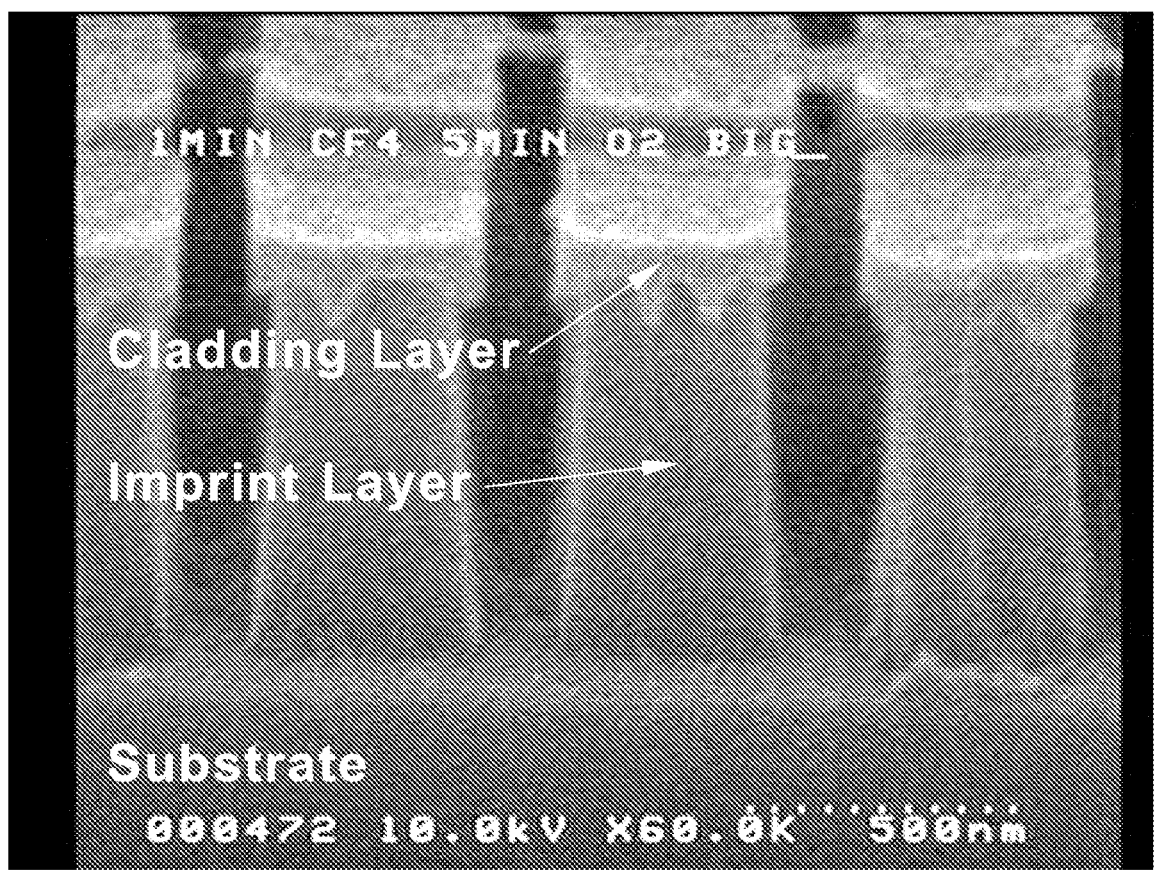
FIG. 4 illustrates cladded resist structures etched to a silicon dioxide substrate surface.

Referring now to the drawings, and more particularly to FIGS. 2A-6, there are shown exemplary embodiments of the method and structures according to the present invention.

Exemplary Embodiment

As mentioned above, conventional practice involves using ultra-filtered resist, extremely clean environments and rigid mask and substrate support to remedy the above problems. These practices are effective, but very expensive in terms of time and complexity.

The present invention was designed to overcome these and other exemplary problems.

Referring now to FIGS. 2A-2D, the present invention provides a simple method of imprint lithography using a system of photoresists that is tolerant of residual layer thickness and of uniformity variations and yet produces high resolution/high aspect resist structures.

In the inventive method, imprint is performed in the conventional way (e.g., as in FIGS. 1A-1D) in which a substrate 20 includes a polymer resist 21 thereon. The polymer resist 21 will be referred to as the "imprint layer."

Turning to FIG. 2A, a second polymer resist layer 22 is then applied (e.g., usually spun-on) the top of the imprint layer 21. Layer 22 will be referred to as the "cladding" or shield layer. It is noted that spinning is preferably used since spinning provides a large degree of precision. Thus, instead of pressing or positioning a template very carefully to provide precision, preferably spinning a layer is performed to achieve the desired precision. It is further noted that the cladding layer preferably is of the planarizing type.

The transfer of the imprinted pattern to the substrate 20 is then performed in three (3) additional etch steps.

As shown in FIG. 2B, a first etch step (e.g., which is selective to the shield layer 22) partially etches the cladding (shield) layer 22 exposing elevated portions of the imprint layer 21. That is, the cladding layer 22 is etched to expose the features in the imprint layer 21.

As shown in FIG. 2C, a second etch step, which is selective to the imprint layer 21 and not selective to the shield layer 22, etches the portions of the imprint layer 21 that were exposed in the first etch step to the substrate 20.

As shown in FIG. 2D, a third etch step etches the substrate 20. That is, in FIG. 2D, the substrate is usually further processed to either etch, deposit or implant material. Illustrated in FIG. 2d is the case where the resist pattern is transferred to the substrate 20 by etching.

FIG. 3 illustrates a flowchart of a method 30 according to the present invention. Specifically, in step 31, the imprint resist is applied to a substrate.

In step 32, the pattern is imprinted into the resist by pressing the mask into the resist and against the substrate, curing the resist and removing the mask from the substrate.

In step 33, the cladding layer is applied to the top of the resist by spinning or another appropriate method.

In step 34, the imprinted pattern is inverted and the top of the cladding layer is etched until the elevated portions of the resist layer are exposed.

In step 35, a second etch step, which is selective to the imprint layer and not selective to the shield layer, etches the portions of the imprint layer that were exposed in the first etch step, to the substrate.

Finally, in step 36, the substrate is further processed to either etch, deposit or implant material.

Again, it is noted that the invention does not rely on pressing and positioning of the template to obtain the precision (e.g., in obtaining a uniform film thickness) required to achieve the etch selectivity needed, the invention achieves its precision by preferably using a thin planarizing cladding layer that is applied by spinning. That is, it is possible to spin a layer to very high precision. The invention advantageously uses such a spinning process. Spinning on a liquid is very precise (as opposed to deposition such as evaporation or sputtering) since it relies on surface tension and the spin speed/rate control the uniformity of film thickness.

It is noted that other methods of applying a planarizing cladding layer are possible including vacuum and CVD deposition. Spinning is advantageous because it is simple, cheap and effective.

In the case of a planarizing photoresist, which is of interest in the present invention, the inventors have seen a very highly uniform thickness over the surface of the wafer. Such would not be possible with a deposition process, which would evidence bumps, unevenness, etc. Spinning is also rapidly performed, and can be done on a wafer basis (as opposed to being applied to a die). Thus, throughput is enhanced. Precision in spinning can be adjusted by suitably setting the spin speed (which can be set one time).

Thus, the invention preferably and advantageously uses a spinning process, thereby eliminating many variables. The invention advantageously uses the property of the planarizing photoresist and the spinning process to obtain the precision which is desirable in the residual layer. Thus, instead of obtaining the precision from something which is difficult to perform, the invention obtains the precision from something which is relatively easy to do and control.

In comparison, returning to FIGS. 1A-1D showing the conventional method, deposition would result in bumps over the features. To get the residual layer both thin and perfectly uniform, many variables must be accounted for (e.g., "right") including the surface of the residual layer must be particle-free, the pressing force must be applied perfectly evenly, the mask must be perfectly flat, the substrate must be perfectly flat, and the pressing must be applied long enough for the residual layer to achieve the required thickness. These are difficult things to do in practice, especially over large areas. Indeed, pressing perfectly a one-inch blank is extremely problematic and difficult, as well as time-consuming (on the order of a minute). The above variables are problems/issues which the planarizing photoresist and the spinning process overcome (and which may take on the order of one second). As shown in the photograph of FIG. 4, the process is illustrated in an actual photoresist at the point where the substrate surface is exposed.

The exemplary embodiment of the present invention includes two exemplary resist types. A first type is a cross-linked organic acrylate which is referred to as the "imprint resist". A second type is a silated planarizing resist which will be referred to as the "shield resist" (or cladding layer resist).

In experimental testing conducted by the present inventors, during the imprint portion of an exemplary operation of the inventive process, a quartz mold (containing the etched features to be transferred on its surface) was pressed into approximately 100 ml of imprint resist that has been placed on the surface of the sample. The sample was customarily pre-treated with a commercial adhesion promoter SIA0200.0 or (3-Acryloxypropyl)trimethoxysilane and the mold was pre-treated with a commercial release agent SIT9174.0 or tridecafluoro-1,1,2,2-tetrahydroctyl trichlorosilane.

The mold was pressed against the sample and exposed to broadband radiation from a mercury source of 25 mW/cm$^2$ for 5 seconds and the mold was removed. The sample was then post baked for 5 minutes at 110 C to complete the curing process. The mold was pressed with sufficient force (approximately 3 kg) to leave a 200 nm-300 nm thick layer of imprint resist on the sample.

In a second portion of the resist application process, the shield resist was applied in liquid form and spun on the sample at 3000 rpm for 30 seconds and the sample was post baked at 200 C for 2 minutes.

The reactive ion etch (RIE) portion of the process was performed using a one minute etch in a $CF_4$ 27 mT, $O_2$ 3 mT and 30 W plasma. This etched the shield (cladding) resist to expose the imprinted feature tops.

The second portion of the etch process was performed using a 4-minute etch in an $O_2$ 30 mT, 30 W plasma. This etched the imprint resist and exposed the surface of the sample. In the case of a silicon dioxide sample, the former etch plasma that includes $CF_4$ can be used to etch into the sample, or in the case of a different material an alternative etch plasma can be used.

Imprint Resist Formulation:
1,3 butanediol diacrylate 97% mole fraction
2-Hydroxy-2-methyl-1-phenyl-propa-1-one (Ciba Darocure 4265) (initiator) 3% mole fraction
5 sec expose at 25 mW/cm2
110 C @ 1.0 minute bake Shield Resist Formulation:
SiArc SHB-A470 Lot TUO 401215 (Shin Etsu Corp.)
3000 RPM spin @ 30 sec
200 C @ 2.0 min bake As evident from the above description, an exemplary problem solved by the present invention is the reduction in sensitivity to the residual layer thickness as described above.

The spun-on shield layer achieves the precision and uniformity necessary to reliably use a timed etch to expose the imprint features which can then be selectively etched to high aspect. The net gain for the process engineer is a dramatic increase in process window for a very simple process.

In contrast, the conventional imprint process is highly sensitive to contamination, deformation of the sample and mold and the viscosity of the resist. The latter requires long periods of time to press the residual layer to the very thin layer required, and is thus a rate limiting factor to the conventional process. The inventive process can operate with a relatively thick residual layer (200 nm-300 nm) and tolerates comparable thickness variations, thus avoiding problems with thickness variations.

A secondary benefit of the inventive process is that the kerf (area between the chips) is protected by the shield layer. Under ordinary imprint processing, the kerf is unprotected and exposed to the etch process.

Hence, in the inventive method, several modifications are introduced to the conventional imprint lithographic method.

The imprint mask may be fabricated or patterned by conventional methods (optical or e beam lithography). Masks are usually created by patterning relief structures in the surface of flat quartz or sapphire substrates.

Figure 5C:
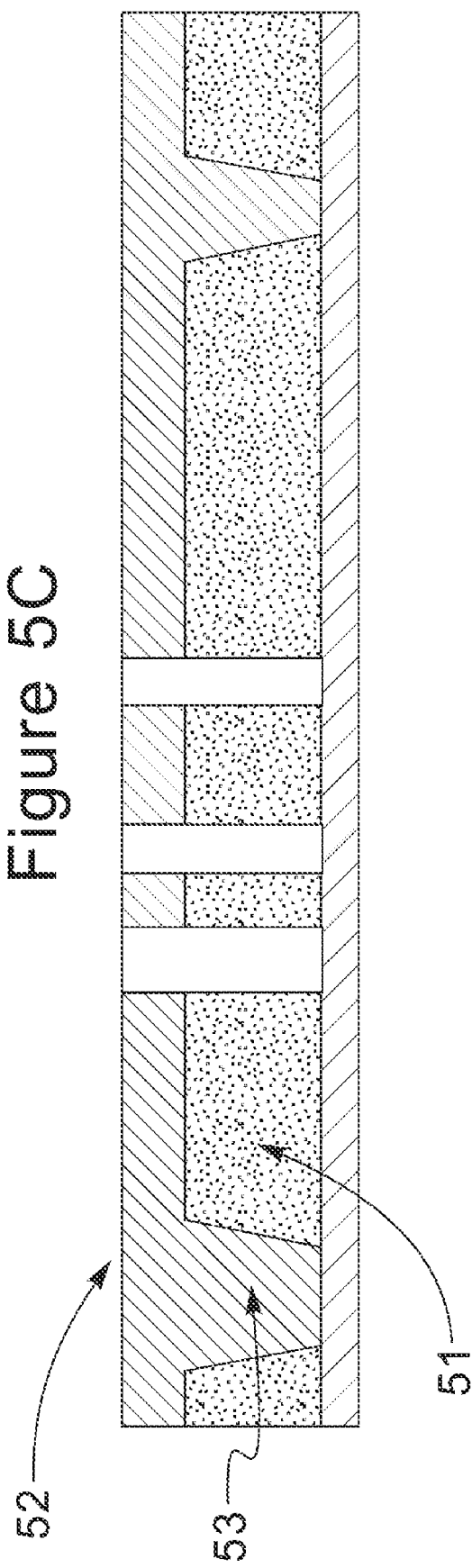
FIG. 5C illustrates the structure of FIG. 5B after etching of the organic resist 53.

Then, the mask may be modified by placing a small number of support spacers (feet) on the mask surface in non critical (unpatterned) regions. These feet may be round flat features approximately 100 microns in diameter and placed on the mask contact surface. A variety of methods and materials can be used to place the spacers. FIG. 5A illustrates a structure 50 after printing and applying a planarizing resist coating 52 over an organic resist 51, and which illustrates spacer feet 53. FIG. 5B illustrates the structure of FIG. 5A after etching of the planarizing resist 52. FIG. 5C illustrates the structure of FIG. 5B after etching of the organic resist 51. FIGS. 5A-5C illustrate structures similar to that shown in FIGS. 2A-2D, with the exception of the feet 53.

An exemplary method of placing spacers is to evaporate silicon dioxide through a contact molybdenum mask. The thickness of the spacer feet is chosen to be relatively large compared to ambient contamination, but on the order of 3X-5X the minimum feature size being printed. Placement of these features on the mask is chosen such that they do not interfere with critical mask features. On a typical 25 mm×25 mm mask, approximately 9 spacer feet may be applied. The lateral shape of the feet is not critical. They should simply support whatever mechanical load is applied to the mask.

Typically deposited are 100 micron-wide, 300 nanometer-thick round silicon dioxide spacers.

That is, an exemplary embodiment of this invention includes a 25 mm×25 mm quartz imprint mask configured with nine 100 micron diameter circular $SiO_2$ feet arranged in a 3×3 array across the mask. The height of the feet is approximately 300 nm.

These spacer feet benefit in several respects. First by effectively thickening the residual layer, the resist more easily flows and reaches equilibrium.

Second, any particulate contamination present on the substrate or in the resist is significantly less likely to influence the placement and parallelism of the mask. The resulting residual layer is thick but very uniform. Thus, the use of feet on the photomask reduces dramatically the probability that a large particle or slight force imbalances on mask or substrate will cause large residual layer variations due to mechanical distortion.

Thus, another alternative embodiment of the invention relates to the provision or presence of the feet which are helpful to the present invention. The feet leave their imprint in the resist. Their functionality is fulfilled once the resist is hardened, but before the spin coating has been applied. The feet guarantee a uniform constant resist thickness. The feet can be any size and the spacing between feet can be tailored according to the designer's requirements and constraints to assure that bow and flatness requirements are met according to the applied load. While the feet may be 10-100 microns thick, there is no requirement to do so. The feet merely should be thick enough to support the load put upon them and achieve the design spacing of the mask and substrate.

It is further noted that numerous uses and applications for the feet including zone plating (e.g., one way of making a lens), immersion lithography, microplating tools, pattern writing, etc. The feet can be applied to anything in which it is desired to stabilize a distance between two plates.

Hence, as shown in FIGS. 2A-2D, imprint is performed in the conventional way in a polymer resist which is referred to as the "imprint layer." A second polymer resist layer is then applied (usually spun on) the top of the imprint layer which is referred to as the "cladding" or "shield" layer. This shield layer takes advantage of the uniformity that is inherent in the spin process.

At this stage of the process, both a uniform known thickness residual layer and a uniform known thickness cladding or shield layer exist. The shield layer is chosen to be selective to a different etch process than the base resist layer.

The transfer of the imprinted pattern to the substrate is then performed in three additional etch steps. The first etch step (which is selective to the shield layer) partially etches the shield layer exposing elevated portions of the imprint layer. The second etch step which is selective to the imprint layer and not selective to the shield layer etches the portions of the imprint layer that were exposed in the first etch step to the substrate. The third etch step etches to the substrate. These steps are illustrated in FIGS. 2A-2D described above.

It is noted that many variations of the present invention can be undertaken and are well within the scope of the present invention. For example, the shield layer can be applied by other methods (e.g., evaporation, sputtering, imprinting, etc., or a combination thereof). The thickness of the shield layer can be additionally tuned by conventional Chemical-Mechanical Polishing (CMP).

FIG. 6 illustrates an imprint lithography system 60 according to the present invention, which includes an imprint applying unit 61 for applying the imprint layer to a substrate.

A spin coating device 62 applies a second polymer resist layer (cladding layer) to the imprint layer.

A transfer device 63 transfers the imprinted pattern to the substrate by etching, and specifically a first etch step, which is selective to the cladding layer, partially etches the cladding layer exposing elevated portions of the imprint layer. Then, the cladding layer is etched to expose the features in the imprint layer. Thereafter, a second etch step, which is selective to the imprint layer and not selective to the cladding layer, etches the portions of the imprint layer that were exposed in the first etch step, to the substrate. The same transfer device 63 may be used for all etches or dedicated transfer devices may be employed for each etch.

A further processing device 64 is provided to further process the substrate and may take the form of either an etch, a deposition, or an implantation material device. A controller 65 may be employed to control the entire process While the invention has been described in terms of several exemplary embodiments, those skilled in the art will recognize that the invention can be practiced with modification within the spirit and scope of the appended claims.

Further, it is noted that, Applicant's intent is to encompass equivalents of all claim elements, even if amended later during prosecution.

What is claimed is:

1. A method of imprint lithography, comprising:
   imprinting, via a patterned mask, a pattern into a resist layer on a substrate; and
   overlaying a cladding layer over said imprinted resist layer,
   wherein a portion of the cladding layer is used as a hard mask for a subsequent processing,
   wherein a transfer of the imprinted pattern is performed in a plurality of etches,
   wherein a first etch, which is selective to the cladding layer, partially etches the cladding layer to expose elevated portions of the imprint layer, and
   wherein said first etch comprises one of a reactive ion etch, sputter etch, plasma etch, wet chemical etch and a chemical downstream etch.

2. The method of claim 1, where said overlaying comprises spinning-on said cladding layer on top of said imprinted resist layer.

3. The method of claim 1, wherein said overlaying comprises depositing the cladding layer by evaporation.

4. The method of claim 1, wherein said overlaying comprises depositing the cladding layer by sputtering.

5. The method of claim 1, further comprising:
   adjusting a thickness of the cladding layer via chemical mechanical polishing (CMP).

6. The method of claim 1, wherein said cladding layer comprises a planarizing cladding layer.

7. The method of claim 1, wherein a second etch, which is selective to the imprint layer and not selective to the cladding layer, etches the portions of the imprint layer that were exposed in the first etch to a substrate under said cladding layer, and
   wherein said second etch comprises one of a reactive ion etch, sputter etch, plasma etch, a wet chemical etch and a chemical downstream etch.

8. The method of claim 7, wherein a third process modifies the substrate, said third process comprising a further processing comprising one of an etch, a deposit, and an implanting of a material.

9. The method of claim 1, wherein said imprint resist comprises a cross-linked organic acrylate, and wherein said cladding layer comprises a silated planarizing resist.

10. The method of claim 1, wherein the cladding layer is applied in a liquid form.

11. The method of claim 1, wherein said first etch comprises one of a reactive ion etch (RIE) and an isotropic etch, thereby to etch the cladding layer to expose tops of imprinted features.

12. The method of claim 7, wherein said second etch comprises a deeper etch than said first etch.

13. The method of claim 1, further comprising:
supporting said patterned mask by a plurality of feet.

14. The method of claim 13, wherein said feet comprise support spacers placed on the mask surface in unpatterned regions thereof.

15. The method of claim 13, wherein said feet are placed by one of evaporating and sputtering a mechanically stable material through a mask, a thickness of the feet being with in a range of about 3 to about 5 times a minimum feature size being printed.

16. A method of imprint lithography, comprising:

imprinting, via a patterned mask, a pattern into a resist layer on a substrate;

overlaying a cladding layer over said imprinted resist layer; and supporting said patterned mask by a plurality of feet, wherein a portion of the cladding layer is used as a hard mask for a subsequent processing, wherein said feet comprise one of silicon dioxide, silicon nitride and amorphous silicon, wherein said feet are placed by evaporation through a patterned mask, and wherein said mask comprises at least one of molybdenum, steel, copper and aluminum.

* * * * *